United States Patent
Yu

(10) Patent No.: US 11,171,247 B2
(45) Date of Patent: Nov. 9, 2021

(54) METAL OXIDE THIN FILM TRANSISTOR AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Wei Yu, Wuhan (CN)

(*) Notice: Subject to any disclaimer, the term of this patent is extended or adjusted under 35 U.S.C. 154(b) by 295 days.

(21) Appl. No.: 16/349,266

(22) PCT Filed: Feb. 18, 2019

(86) PCT No.: PCT/CN2019/075319
§ 371 (c)(1),
(2) Date: May 12, 2019

(87) PCT Pub. No.: WO2020/118890
PCT Pub. Date: Jun. 18, 2020

(65) Prior Publication Data
US 2021/0184017 A1    Jun. 17, 2021

(30) Foreign Application Priority Data
Dec. 13, 2018  (CN) .......................... 201811526866.0

(51) Int. Cl.
*H01L 29/786* (2006.01)
*H01L 21/283* (2006.01)
*H01L 29/66* (2006.01)

(52) U.S. Cl.
CPC ...... *H01L 29/78696* (2013.01); *H01L 21/283* (2013.01); *H01L 29/66742* (2013.01); *H01L 29/78633* (2013.01); *H01L 2221/1057* (2013.01)

(58) Field of Classification Search
CPC ... H01L 21/28; H01L 21/283; H01L 21/8234; H01L 21/823462; H01L 21/823857;
(Continued)

(56) References Cited

U.S. PATENT DOCUMENTS

2010/0244029 A1*  9/2010  Yamazaki ......... H01L 29/42384
                                                    257/52
2017/0154773 A1   6/2017  Zhou et al.
(Continued)

FOREIGN PATENT DOCUMENTS

| CN | 105070724 A | 11/2015 |
| CN | 106876332 A | 6/2017 |
| KR | 20130022450 A | 3/2013 |

OTHER PUBLICATIONS

Machine Translation of KR 20130022450A (Year: 2013).*

*Primary Examiner* — Cheung Lee

(57) ABSTRACT

Disclosed is a metal oxide thin film transistor and a manufacturing method thereof. By disposing a portion of the source and a portion of the drain in the same layer as the first insulating layer, the reflection of the ultraviolet light by the source, the drain and the first insulating layer can be blocked from entering the conductive channel. Therefore, a threshold voltage shift of the metal oxide thin film transistor under irradiation of ultraviolet light to the conductive channel can be prevented, and the threshold voltage stability and display quality are improved.

20 Claims, 2 Drawing Sheets

(58) Field of Classification Search
CPC ............. H01L 27/1214; H01L 27/1237; H01L 27/124; H01L 27/1248; H01L 27/1251; H01L 27/1259; H01L 27/127; H01L 27/28; H01L 27/32; H01L 27/3248; H01L 27/3262; H01L 29/66007; H01L 29/66742; H01L 29/66765; H01L 29/772; H01L 29/78; H01L 29/786; H01L 29/78633; H01L 29/78642; H01L 29/78696

See application file for complete search history.

(56) References Cited

U.S. PATENT DOCUMENTS

2018/0083049 A1\* 3/2018 Sakata .............. H01L 29/78648
2018/0277660 A1 9/2018 Liu \* cited by examiner

METAL OXIDE THIN FILM TRANSISTOR AND MANUFACTURING METHOD THEREOF

FIELD OF THE INVENTION

The present application relates to a display field, and more particularly to a metal oxide thin film transistor and a manufacturing method thereof.

BACKGROUND OF THE INVENTION

Metal oxide thin film transistors have become a research hotspot in the field of display technology due to their high mobility and suitability for large area production.

However, the conductive channel of the metal oxide thin film transistor is very sensitive to the process and the environment, and it is often necessary to add a mask to protect the conductive channel layer by using a light shielding structure, which is disadvantageous for the process cost reduction. Meanwhile, due to the stacking of the source, the drain and the light shielding structure, the size of the conductive channel is large, and the parasitic capacitance is also large. In addition, under the irradiation of ultraviolet light to the conductive channel, the threshold voltage of the metal oxide thin film transistor easily shifts, resulting in unstable display performance of the display.

Therefore, the prior art possesses drawbacks and is in urgent need of improvement.

SUMMARY OF THE INVENTION

An objective of the embodiment of the present invention is to provide a metal oxide thin film transistor and a manufacturing method thereof, which can solve the problem that a threshold voltage of the metal oxide thin film transistor is shifted under irradiation of ultraviolet light to a conductive channel, resulting in a technical problem that causes the display to be unstable.

The embodiment of the present application provides a metal oxide thin film transistor, including:

a substrate;

a gate, disposed on the substrate;

a first insulating layer, disposed on the gate and the substrate, wherein the first insulating layer is provided with a first through hole penetrating the substrate and a second through hole penetrating the substrate, and the first through hole is located at one side of the gate, and the second through hole is located at an other side of the gate;

a conductive channel, disposed on the first insulating layer and opposite to the gate;

a source and a drain, wherein the source is disposed at one side of the conductive channel and extends to the first through hole, and the drain is disposed on an other side of the conductive channel and extends to the second through hole;

wherein the source includes a first source portion, a second source portion and a third source portion, and the first source portion is disposed on the conductive channel, and the second source portion is disposed on the first insulating layer, and the third source portion covers the first through hole;

the drain includes a first drain portion, a second drain portion and a third drain portion, and the first drain portion is disposed on the conductive channel, and the second drain portion is disposed on the first insulating layer, and the third drain portion covers the second through hole;

the first insulating layer includes a first insulating portion, a second insulating portion and a third insulating portion; and the second insulating portion is disposed between the first through hole and the second through hole, and the first insulating portion is disposed at one side of the first through hole remote from the gate, and the third insulating portion is disposed at one side of the second through hole remote from the gate.

In the metal oxide thin film transistor of the present application, the first source portion and the first drain portion are insulated from each other.

In the metal oxide thin film transistor of the present application, the second insulating portion includes a first sub insulating portion disposed on the gate, a second sub insulating portion disposed at the one side of the gate and a third sub insulating portion disposed at the other side of the gate; the first sub insulating portion, the second sub insulating portion and the third sub insulating portion are integrally formed.

In the metal oxide thin film transistor of the present application, a distance between the first through hole and the gate is less than 1 um, and a distance between the second through hole and the gate is less than 1 um.

In the metal oxide thin film transistor of the present application, the metal oxide thin film transistor further includes a second insulating layer and a light shielding metal;

the second insulating layer is disposed on the source, the drain, the conductive channel and the first insulating layer, and the light shielding metal layer is disposed on the second insulating layer.

In the metal oxide thin film transistor of the present application, the light shielding metal is disposed opposite to the conductive channel.

The embodiment of the present application further provides a metal oxide thin film transistor, including:

a substrate;

a gate, disposed on the substrate;

a first insulating layer, disposed on the gate and the substrate, wherein the first insulating layer is provided with a first through hole penetrating the substrate and a second through hole penetrating the substrate, and the first through hole is located at one side of the gate, and the second through hole is located at an other side of the gate;

a conductive channel, disposed on the first insulating layer and opposite to the gate;

a source and a drain, wherein the source is disposed at one side of the conductive channel and extends to the first through hole, and the drain is disposed on an other side of the conductive channel and extends to the second through hole.

In the metal oxide thin film transistor of the present application, the source includes a first source portion, a second source portion and a third source portion, and the first source portion is disposed on the conductive channel, and the second source portion is disposed on the first insulating layer, and the third source portion covers the first through hole;

the drain includes a first drain portion, a second drain portion and a third drain portion, and the first drain portion is disposed on the conductive channel, and the second drain portion is disposed on the first insulating layer, and the third drain portion covers the second through hole.

In the metal oxide thin film transistor of the present application, the first source portion and the first drain portion are insulated from each other.

In the metal oxide thin film transistor of the present application, the first insulating layer includes a first insulating portion, a second insulating portion and a third insulating portion; and the second insulating portion is disposed between the first through hole and the second through hole, and the first insulating portion is disposed at one side of the first through hole remote from the gate, and the third insulating portion is disposed at one side of the second through hole remote from the gate.

In the metal oxide thin film transistor of the present application, the second insulating portion includes a first sub insulating portion disposed on the gate, a second sub insulating portion disposed at the one side of the gate and a third sub insulating portion disposed at the other side of the gate; the first sub insulating portion, the second sub insulating portion and the third sub insulating portion are integrally formed.

In the metal oxide thin film transistor of the present application, a distance between the first through hole and the gate is less than 1 um, and a distance between the second through hole and the gate is less than 1 um.

In the metal oxide thin film transistor of the present application, the metal oxide thin film transistor further includes a second insulating layer and a light shielding metal;

the second insulating layer is disposed on the source, the drain, the conductive channel and the first insulating layer, and the light shielding metal layer is disposed on the second insulating layer.

In the metal oxide thin film transistor of the present application, the light shielding metal is disposed opposite to the conductive channel.

The embodiment of the present application further provides a manufacturing method of a metal oxide thin film transistor, including steps of:

forming a gate on a substrate;

depositing a first insulating layer on the gate and the substrate, and patterning the first insulating layer to form a first through hole penetrating the substrate and a second through hole penetrating the substrate, wherein the first through hole is located at one side of the gate, and the second through hole is located at an other side of the gate;

forming a conductive channel on the first insulating layer, wherein the first insulating layer is opposite to the gate; and forming a source and a drain, wherein the source is disposed at one side of the conductive channel and extends to the first through hole, and the drain is disposed on an other side of the conductive channel and extends to the second through hole.

In the manufacturing method of the metal oxide thin film transistor of the present application, a distance between the first through hole and the gate is less than 1 um, and a distance between the second through hole and the gate is less than 1 um.

In the manufacturing method of the metal oxide thin film transistor of the present application, the source includes a first source portion, a second source portion and a third source portion, and the first source portion is disposed on the conductive channel, and the second source portion is disposed on the first insulating layer, and the third source portion covers the first through hole;

the drain includes a first drain portion, a second drain portion and a third drain portion, and the first drain portion is disposed on the conductive channel, and the second drain portion is disposed on the first insulating layer, and the third drain portion covers the second through hole.

In the manufacturing method of the metal oxide thin film transistor of the present application, the first source portion and the first drain portion are insulated from each other.

In the manufacturing method of the metal oxide thin film transistor of the present application, the first insulating layer includes a first insulating portion, a second insulating portion and a third insulating portion; and the second insulating portion is disposed between the first through hole and the second through hole, and the first insulating portion is disposed at one side of the first through hole remote from the gate, and the third insulating portion is disposed at one side of the second through hole remote from the gate.

In the manufacturing method of the metal oxide thin film transistor of the present application, the second insulating portion includes a first sub insulating portion disposed on the gate, a second sub insulating portion disposed at the one side of the gate and a third sub insulating portion disposed at the other side of the gate; the first sub insulating portion, the second sub insulating portion and the third sub insulating portion are integrally formed.

In the metal oxide thin film transistor and the manufacturing method thereof according to the embodiment of the present application, by disposing a portion of the source and a portion of the drain in the same layer as the first insulating layer, the reflection of the ultraviolet light by the source, the drain and the first insulating layer can be blocked from entering the conductive channel. Therefore, a threshold voltage shift of the metal oxide thin film transistor under irradiation of ultraviolet light to the conductive channel can be prevented, and the threshold voltage stability and display quality are improved.

BRIEF DESCRIPTION OF THE DRAWINGS

In order to more clearly illustrate the embodiments of the present application, the following figures will be described in the embodiments are briefly introduced. It is obvious that the drawings are only some embodiments of the present application, those of ordinary skill in this field can obtain other figures according to these figures without paying the premise.

DETAILED DESCRIPTION OF PREFERRED EMBODIMENTS

Figure 1:
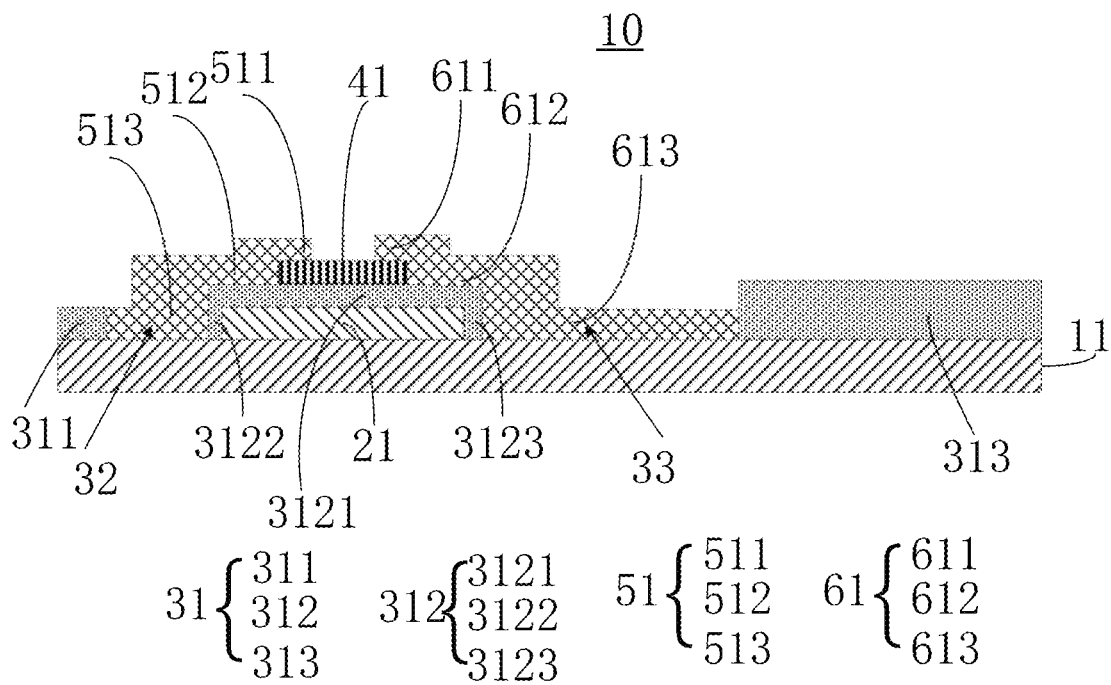
FIG. 1 is a structural view diagram of a metal oxide thin film transistor according to an embodiment of the present application.

The embodiments of the present application are described in detail below, and the examples of the embodiments are illustrated in the drawings, wherein the same or similar reference numerals are used to refer to the same or similar elements or elements having the same or similar functions. The embodiments described below with reference to the drawings are intended to be illustrative for the present application and are not to be construed as limitation.

In the description of the present application, it is to be understood that the terms "center", "longitudinal", "transverse", "length", "width", "thickness", "upper", "lower", "front", "Orientation of "post", "left", "right", "vertical", "horizontal", "top", "bottom", "inside", "outside", "clockwise", "counterclockwise", etc. are positional relationships based on the orientations or positional relationships shown in the drawings, and are merely for the convenience of the description of the present application and the simplified description, and do not indicate or imply that the device or component referred to have specific orientations, and are constructed and operated in specific orientations. Therefore, these should not be construed as limiting the present application. Moreover, the terms "first" and "second" are used for descriptive purposes only and are not to be construed as indicating or implying a relative importance or implicitly indicating the number of indicated technical features. Thus, features defining "first" and "second" may include one or more of the features with either explicitly or implicitly. In the description of the present application, "plurality" means two or more unless with being specifically indicated otherwise.

In the description of the present application, which needs explanation is that the term "installation", "connected", "connection" should be broadly understood unless those are clearly defined and limited, otherwise, For example, those can be a fixed connection, a detachable connection, or an integral connection; those can be a mechanical connection, an electrical connection or a mutual communication; those can be a direct connection, or an indirect connection with an intermediary, which may be an internal communication of two elements or an interaction of two elements. To those of ordinary skill in the art, the specific meaning of the above terminology in the present application can be understood according to the specific circumstances.

In the present application, the first feature "on" or "under" the second feature may include direct contact of the first and second features, and may also include that the first and second features are not in direct contact but are contacted by additional features between them. Moreover, the first feature "above", "above" and "on" the second feature includes that the first feature is directly above and obliquely above the second feature, or merely indicates that a level of the first feature is higher than that of the second feature. The first feature "below", "under" and "beneath" the second feature includes that the first feature is directly below and obliquely below the second feature, or merely indicates that a level of the first feature is lower than that of the second feature.

The following disclosure provides many different embodiments or illustrations for implementing different structures of the present application. In order to simplify the disclosure of the present application, the components and arrangements of the specific illustrations are described below. Certainly, they are merely illustrations and are not intended to limit the present application. In addition, the present application may be repeated with reference to the numerals and/or reference numerals in the various embodiments, which are for the purpose of simplicity and clarity, and do not indicate the relationship between the various embodiments and/or arrangements discussed. Moreover, the present application provides illustrations of various specific processes and materials, but one of ordinary skill in the art will recognize the use of other processes and/or the use of other materials.

Please refer to FIG. 1. FIG. 1 is a structural view diagram of a metal oxide thin film transistor according to an embodiment of the present application. As shown in FIG. 1, the metal oxide thin film transistor 10 includes a substrate 11, a gate 21, a first insulating layer 31, a conductive channel 41, a source 51 and a drain 61.

The gate 21 is disposed on the substrate 11. The first insulating layer 31 is disposed on the gate 21 and the substrate 11. The first insulating layer 31 is provided with a first through hole 32 penetrating and a second through hole 33 penetrating the substrate 11. The first through hole 32 is located at one side of the gate 21, and the second through hole 33 is located at an other side of the gate 21. The conductive channel 41 is disposed on the first insulating layer 31 and opposite to the gate 21. The source 51 is disposed at one side of the conductive channel 41 and extends to the first through hole 32. The drain 61 is disposed on an other side of the conductive channel 41 and extends to the second through hole 33. Specifically, the one side of the gate 21 and the other side of the gate 21 herein refer to opposite sides of the gate 21. Similarly, the one side of the conductive channel 41 and the other side of the conductive channel 41 herein refer to opposite sides of the conductive channel 41.

In some embodiments, the substrate 11 may be a transparent glass substrate 11 or a flexible substrate 11.

In some embodiments, the gate 21 can be formed by depositing a layer of metal on the substrate 11 followed by a patterning process. A material of the gate 21 may be Mo, Al, Cu, Ti or Cr.

In some embodiments, the first insulating layer 31 can be formed by silicon dioxide deposition. The first insulating layer 31 of the embodiment of the present application is different from the arrangement of the prior art. Namely, after the first insulating layer 31 is formed on the substrate 11, the first through hole 32 and the second through hole 33 penetrating the substrate 11 are formed in the first insulating layer 31 in the embodiment of the present application. In the embodiment of the present application, the first through hole 32 and the second through hole 33 are disposed in the first insulating layer 31, so that light can be prevented from being reflected to the conductive channel 41 by reflection. For instance, a distance between the first through hole 32 and the gate 21 can be set to be less than 1 um, and a distance between the second through hole 33 and the gate 21 can be set to be less than 1 um, thereby preventing light from being reflected therefrom to the conductive channel 41.

Certainly, a thickness of the region of the first insulating layer 31 on the gate electrode 21 is as small as possible. When electrical isolation is satisfied, the smallest possible thickness reduces the possibility of light being reflected into the conductive channel 41.

In some embodiments, the material of the conductive channel 41 may be indium gallium zinc oxide.

In some embodiments, the source 51 and the drain 61 may be formed by first forming a metal layer and then by a patterning process. Similarly, a material of the source 51 and the drain 61 may be Mo, Al, Cu, Ti or Cr.

Please continue to refer to FIG. 1. The source 51 includes a first source portion 511, a second source portion 512 and a third source portion 513. The first source portion 511 is disposed on the conductive channel 41, and the second source portion 512 is disposed on the first insulating layer 31, and the third source portion 513 covers the first through hole 32. The drain 61 includes a first drain portion 611, a second drain portion 612 and a third drain portion 613. The first drain portion 611 is disposed on the conductive channel 41, and the second drain portion 612 is disposed on the first insulating layer 31, and the third drain portion 613 covers the second through hole 33. The first source portion 511 and the first drain portion 611 are insulated from each other.

The first insulating layer 31 includes a first insulating portion 311, a second insulating portion 312 and a third insulating portion 313; the second insulating portion 312 is disposed between the first through hole 32 and the second through hole 33, and the first insulating portion 311 is disposed at one side of the first through hole 32 remote from the gate 21, and the third insulating portion 313 is disposed at one side of the second through hole 33 remote from the gate 21.

Specifically, the second insulating portion 312 includes a first sub insulating portion 3121 disposed on the gate 21, a second sub insulating portion 3122 disposed at the one side of the gate 21 and a third sub insulating portion 3123 disposed at the other side of the gate 21; the first sub insulating portion 3121, the second sub insulating portion 3122 and the third sub insulating portion 3123 are integrally formed.

In the metal oxide thin film transistor of the embodiment of the present application, by disposing a portion of the source 51 and a portion of the drain 61 in the same layer as the first insulating layer 31, the reflection of the ultraviolet light by the source 51, the drain 61 and the first insulating layer 31 can be blocked from entering the conductive channel 41. Therefore, a threshold voltage shift of the metal oxide thin film transistor under irradiation of ultraviolet light to the conductive channel 41 can be prevented, and the threshold voltage stability and display quality are improved.

Figure 2:
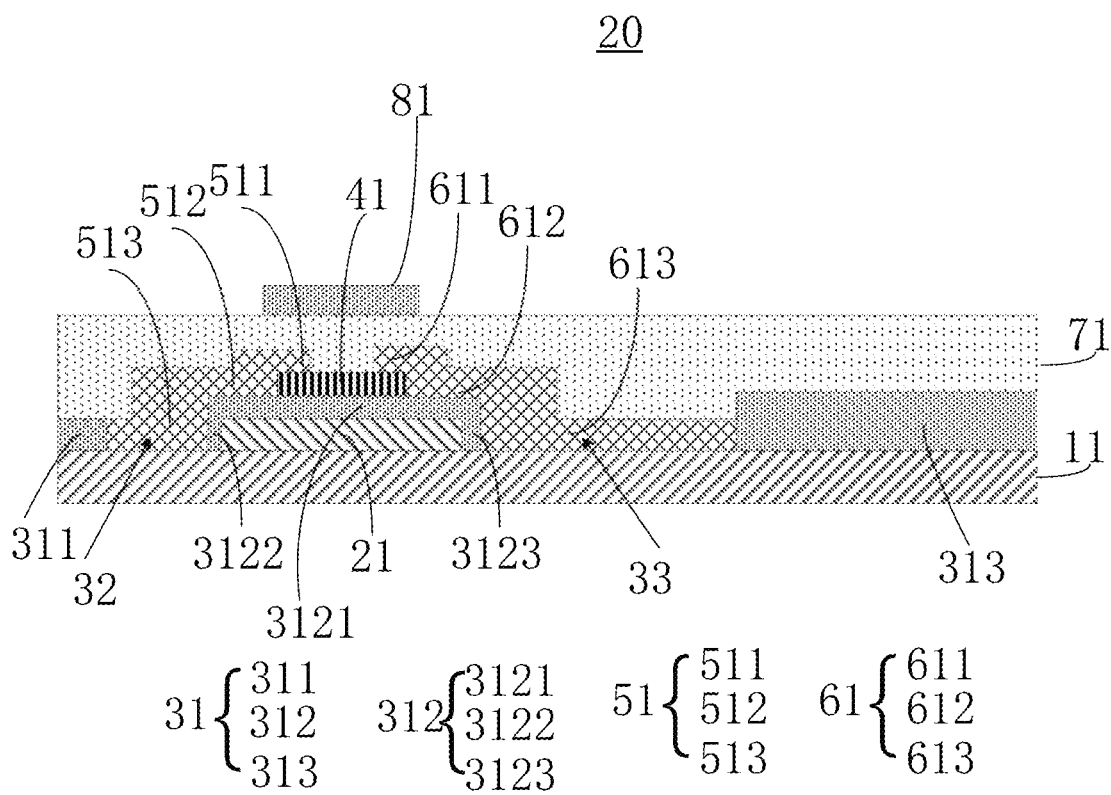
FIG. 2 is another structural view diagram of a metal oxide thin film transistor according to an embodiment of the present application.

Please refer to FIG. 2. FIG. 2 is another structural view diagram of a metal oxide thin film transistor according to an embodiment of the present application. The metal oxide thin film transistor 20 shown in FIG. 2 differs from the metal oxide thin film transistor 10 shown in FIG. 1 in that: the metal oxide thin film transistor 20 shown in FIG. 2 further includes a second insulating layer 71 and a light shielding metal 81. Namely, the metal oxide thin film transistor 20 shown in FIG. 2 can further prevent light from entering the conductive channel 41 by providing the second insulating layer 71 and the light shielding metal 81 on the source 51 and the drain 61.

In some embodiments, the second insulating layer 71 is disposed on the source 51, the drain 61, the conductive channel 41 and the first insulating layer 31. The light shielding metal layer 81 is disposed on the second insulating layer 71. The light shielding metal 81 is disposed opposite to the conductive channel 41.

Figure 3:
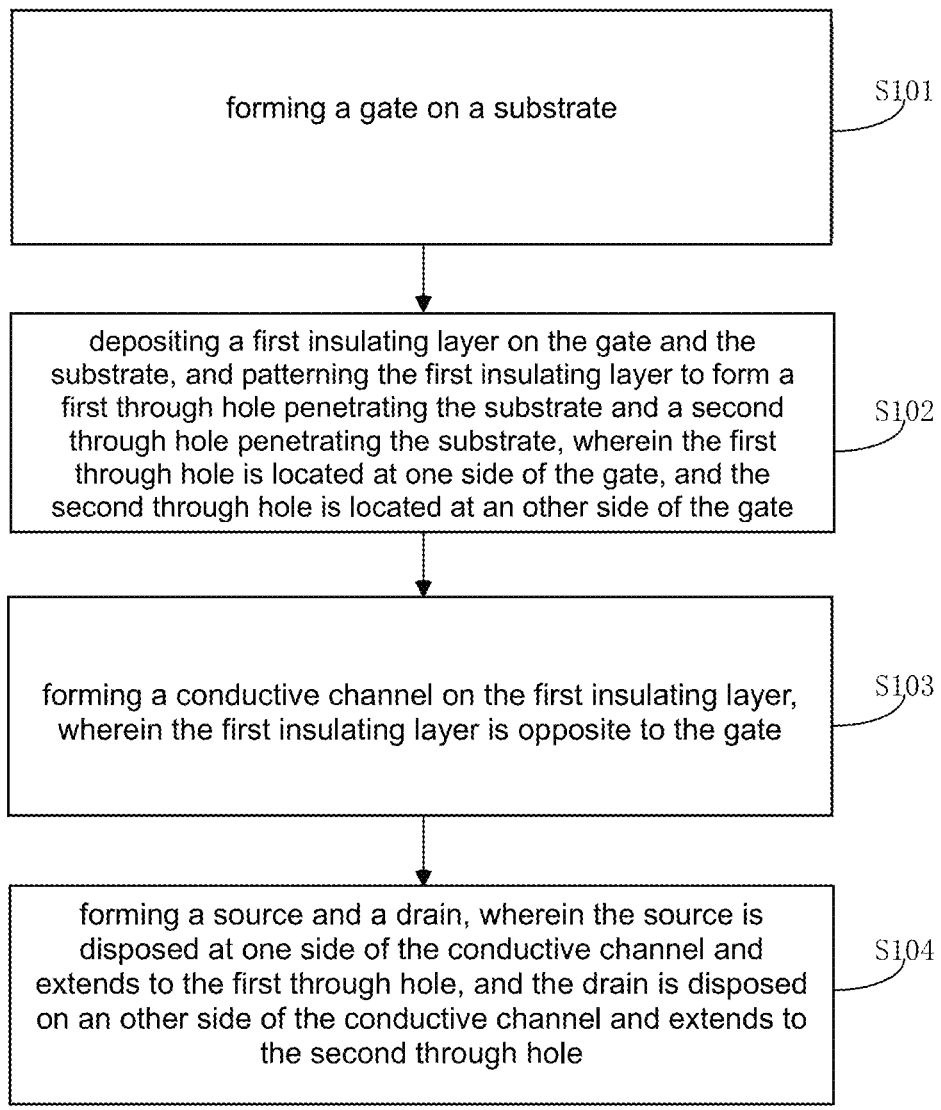
FIG. 3 is flowchart diagram of a manufacturing method of a metal oxide thin film transistor according to an embodiment of the present application.

Please refer to FIG. 3. FIG. 3 is flowchart diagram of a manufacturing method of a metal oxide thin film transistor according to an embodiment of the present application. The metal oxide thin film transistor is the metal oxide thin film transistor described in the aforesaid embodiment. The manufacturing method of the metal oxide thin film transistor includes steps of:

Step S101, forming a gate on a substrate.

Step S102, depositing a first insulating layer on the gate and the substrate, and patterning the first insulating layer to form a first through hole penetrating the substrate and a second through hole penetrating the substrate, wherein the first through hole is located at one side of the gate, and the second through hole is located at an other side of the gate.

Step S103, forming a conductive channel on the first insulating layer, wherein the first insulating layer is opposite to the gate.

Step S104, forming a source and a drain, wherein the source is disposed at one side of the conductive channel and extends to the first through hole, and the drain is disposed on an other side of the conductive channel and extends to the second through hole.

In addition, the manufacturing method of the metal oxide thin film transistor of the embodiment of the present application may further include disposing a second insulating layer and a light shielding metal on the source and the drain. Specifically, the second insulating layer is disposed on the source, the drain, the conductive channel and the first insulating layer. The light shielding metal layer is disposed on the second insulating layer. The light shielding metal is disposed opposite to the conductive channel.

In the metal oxide thin film transistor and the manufacturing method thereof according to the embodiment of the present application, by disposing a portion of the source and a portion of the drain in the same layer as the first insulating layer, the reflection of the ultraviolet light by the source, the drain and the first insulating layer can be blocked from entering the conductive channel. Therefore, a threshold voltage shift of the metal oxide thin film transistor under irradiation of ultraviolet light to the conductive channel can be prevented, and the threshold voltage stability and display quality are improved.

In the description of the present specification, the description with reference to terms "one embodiment", "some embodiments", "illustrative embodiment", "example", "specific example" or "some examples", etc refers to the specific features, structures, materials, or characteristics described in the embodiments or examples which are included in at least one embodiment or example of the application. In the present specification, the terms of the above schematic representation do not certainly refer to the same embodiment or example. Meanwhile, the particular features, structures, materials, or characteristics which are described may be combined in a suitable manner in any one or more embodiments or examples.

In summary, although the above preferred embodiments of the present application are disclosed, the foregoing preferred embodiments are not intended to limit the invention, those skilled in the art can make various kinds of alterations and modifications without departing from the spirit and scope of the present application. Thus, the scope of protection of the present application is defined by the scope of the claims.

Although the above preferred embodiments of the present application are disclosed, the foregoing preferred embodiments are not intended to limit the invention, those skilled in the art can make various kinds of alterations and modifications without departing from the spirit and scope of the present application. Thus, the scope of protection of the present application is defined by the scope of the claims.

What is claimed is:

1. A metal oxide thin film transistor, including:
   a substrate;
   a gate, disposed on the substrate;
   a first insulating layer, disposed on the gate and the substrate, wherein the first insulating layer is provided with a first through hole penetrating the substrate and a second through hole penetrating the substrate, and the first through hole is located at one side of the gate, and the second through hole is located at another side of the gate;
   a conductive channel, disposed on the first insulating layer and opposite to the gate;
   a source and a drain, wherein the source is disposed at one side of the conductive channel and extends to the first through hole, and the drain is disposed on another side of the conductive channel and extends to the second through hole; and
   a second insulating layer disposed on the source, the drain, the conductive channel, and the first insulating layer, wherein the source includes a first source portion, a second source portion and a third source portion, and the first source portion is disposed on the conductive channel, and the second source portion is disposed on the first insulating layer, and the third source portion covers the first through hole;

the drain includes a first drain portion, a second drain portion and a third drain portion, and the first drain portion is disposed on the conductive channel, and the second drain portion is disposed on the first insulating layer, and the third drain portion covers the second through hole;

the first insulating layer includes a first insulating portion, a second insulating portion and a third insulating portion;

the second insulating portion is disposed between the first through hole and the second through hole, and the first insulating portion is disposed at one side of the first through hole remote from the gate, and the third insulating portion is disposed at one side of the second through hole remote from the gate; and the third insulating portion has a sidewall in direct contact with both the drain and the second insulating layer.

2. The metal oxide thin film transistor according to claim 1, wherein the first source portion and the first drain portion are insulated from each other.

3. The metal oxide thin film transistor according to claim 1, wherein the second insulating portion includes a first sub insulating portion disposed on the gate, a second sub insulating portion disposed at the one side of the gate and a third sub insulating portion disposed at the other side of the gate; the first sub insulating portion, the second sub insulating portion and the third sub insulating portion are integrally formed.

4. The metal oxide thin film transistor according to claim 1, wherein a distance between the first through hole and the gate is less than 1 um, and a distance between the second through hole and the gate is less than 1 um.

5. The metal oxide thin film transistor according to claim 1, wherein the metal oxide thin film transistor further includes a light shielding metal; and the light shielding metal layer is disposed on the second insulating layer.

6. The metal oxide thin film transistor according to claim 5, wherein the light shielding metal is disposed opposite to the conductive channel.

7. A metal oxide thin film transistor, including:
a substrate;
a gate, disposed on the substrate;
a first insulating layer, disposed on the gate and the substrate, wherein the first insulating layer is provided with a first through hole penetrating the substrate and a second through hole penetrating the substrate, and the first through hole is located at one side of the gate, and the second through hole is located at another side of the gate;
a conductive channel, disposed on the first insulating layer and opposite to the gate;
a source and a drain, wherein the source is disposed at one side of the conductive channel and extends to the first through hole, and the drain is disposed on another side of the conductive channel and extends to the second through hole; and
a second insulating layer disposed on the source, the drain, the conductive channel, and the first insulating layer, wherein the source includes a first source portion, a second source portion and a third source portion, and a third insulating portion has a sidewall in direct contact with both the drain and the second insulating layer.

8. The metal oxide thin film transistor according to claim 7, wherein the first source portion is disposed on the conductive channel, and the second source portion is disposed on the first insulating layer, and the third source portion covers the first through hole;

the drain includes a first drain portion, a second drain portion and a third drain portion, and the first drain portion is disposed on the conductive channel, and the second drain portion is disposed on the first insulating layer, and the third drain portion covers the second through hole.

9. The metal oxide thin film transistor according to claim 8, wherein the first source portion and the first drain portion are insulated from each other.

10. The metal oxide thin film transistor according to claim 7, wherein the first insulating layer includes a first insulating portion, a second insulating portion and a third insulating portion;

the second insulating portion is disposed between the first through hole and the second through hole, and the first insulating portion is disposed at one side of the first through hole remote from the gate, and the third insulating portion is disposed at one side of the second through hole remote from the gate.

11. The metal oxide thin film transistor according to claim 10, wherein the second insulating portion includes a first sub insulating portion disposed on the gate, a second sub insulating portion disposed at the one side of the gate and a third sub insulating portion disposed at the another side of the gate; the first sub insulating portion, the second sub insulating portion and the third sub insulating portion are integrally formed.

12. The metal oxide thin film transistor according to claim 7, wherein a distance between the first through hole and the gate is less than 1 um, and a distance between the second through hole and the gate is less than 1 um.

13. The metal oxide thin film transistor according to claim 7, wherein the metal oxide thin film transistor further includes a light shielding metal; and the light shielding metal layer is disposed on the second insulating layer.

14. The metal oxide thin film transistor according to claim 13, wherein the light shielding metal is disposed opposite to the conductive channel.

15. A manufacturing method of a metal oxide thin film transistor, including steps of:

forming a gate on a substrate;

depositing a first insulating layer on the gate and the substrate, and patterning the first insulating layer to form a first through hole penetrating the substrate and a second through hole penetrating the substrate, wherein the first through hole is located at one side of the gate, and the second through hole is located at another side of the gate;

forming a conductive channel on the first insulating layer, wherein the first insulating layer is opposite to the gate; and forming a source and a drain, wherein the source is disposed at one side of the conductive channel and extends to the first through hole, and the drain is disposed on another side of the conductive channel and extends to the second through hole; and forming a second insulating layer on the source, the drain, the conductive channel, and the first insulating layer,
wherein the source includes a first source portion, a second source portion and a third source portion, and a third insulating portion has a sidewall in direct contact with both the drain and the second insulating layer.

16. The manufacturing method of the metal oxide thin film transistor according to claim 15, wherein a distance between the first through hole and the gate is less than 1 um, and a distance between the second through hole and the gate is less than 1 um.

17. The manufacturing method of the metal oxide thin film transistor according to claim 15, wherein the first source portion is disposed on the conductive channel, and the second source portion is disposed on the first insulating layer, and the third source portion covers the first through hole;
the drain includes a first drain portion, a second drain portion and a third drain portion, and the first drain portion is disposed on the conductive channel, and the second drain portion is disposed on the first insulating layer, and the third drain portion covers the second through hole.

18. The manufacturing method of the metal oxide thin film transistor according to claim 17, wherein the first source portion and the first drain portion are insulated from each other.

19. The manufacturing method of the metal oxide thin film transistor according to claim 15, wherein the first insulating layer includes a first insulating portion, a second insulating portion and a third insulating portion;
the second insulating portion is disposed between the first through hole and the second through hole, and the first insulating portion is disposed at one side of the first through hole remote from the gate, and the third insulating portion is disposed at one side of the second through hole remote from the gate.

20. The manufacturing method of the metal oxide thin film transistor according to claim 19, wherein the second insulating portion includes a first sub insulating portion disposed on the gate, a second sub insulating portion disposed at the one side of the gate and a third sub insulating portion disposed at the another side of the gate; the first sub insulating portion, the second sub insulating portion and the third sub insulating portion are integrally formed.

* * * * *